(12) United States Patent
Kasahara et al.

(10) Patent No.: US 7,287,316 B2
(45) Date of Patent: Oct. 30, 2007

(54) LAPPING MONITOR DEVICE, SYSTEM AND METHOD

(75) Inventors: Noriaki Kasahara, Tokyo (JP); Nozomu Hachisuka, Tokyo (JP); Yasutoshi Fujita, Tokyo (JP)

(73) Assignee: TDK Corporation, Tokyo (JP)

( * ) Notice: Subject to any disclaimer, the term of this patent is extended or adjusted under 35 U.S.C. 154(b) by 495 days.

(21) Appl. No.: 10/195,106

(22) Filed: Jul. 15, 2002

(65) Prior Publication Data
US 2003/0020467 A1    Jan. 30, 2003

(30) Foreign Application Priority Data
Jul. 30, 2001    (JP)    ............... 2001-228893

(51) Int. Cl.
*B23P 19/00* (2006.01)
*G11B 5/187* (2006.01)
(52) U.S. Cl. ............... 29/737; 29/603.12; 451/1; 451/5; 451/41; 360/313
(58) Field of Classification Search ............... 29/737, 29/603.12, 603.15, 603.16, 603.18; 451/1, 451/5, 41; 360/313, 317, 318; 427/10; 428/694 T, 428/694 TM
See application file for complete search history.

(56) References Cited

U.S. PATENT DOCUMENTS 4,489,484 A * 12/1984 Lee ............... 29/603.18
4,592,921 A * 6/1986 Hieber et al. ............... 427/10 X
5,514,469 A * 5/1996 Shinjo et al. ............... 428/694 TM X
6,170,149 B1 * 1/2001 Oshiki et al. ............... 29/603.15 X

FOREIGN PATENT DOCUMENTS

| JP | 02-301010 | 12/1990 |
|---|---|---|
| JP | 10-289413 | 10/1998 |
| JP | 2003-46163 | * 2/2003 |

* cited by examiner

*Primary Examiner*—A. Dexter Tugbang
(74) *Attorney, Agent, or Firm*—Oblon, Spivak, McClelland, Maier & Neustadt, P.C.

(57) ABSTRACT

A lapping monitor element that is juxtaposed with a magnetic transducer element having a magnetoresistance effect film to determine the lapping position upon lapping the element height of the magnetic transducer element to a predetermined dimension. The lapping monitor element includes a resistance film to be resistance measured. The resistance film is a metal film of nonmagnetic transition metal or of alloy composed mainly of nonmagnetic transition metal, or a multilayered film where two or more such metal films are laid one upon another. The lapping monitor makes it possible to extremely stabilize the ELG sensor resistance measured values upon lapping as well as to provide a high accuracy MR height control.

6 Claims, 18 Drawing Sheets

LAPPING MONITOR DEVICE, SYSTEM AND METHOD

BACKGROUND OF THE INVENTION

1. Field of the Invention

The present invention relates to a lapping monitor element that is juxtaposed with a magnetic transducer element having a magnetoresistance effect film in order to determine the lapping position of a substrate, upon lapping the element height of the magnetic transducer element to a desired dimension. The invention relates further to a combination consisting of the magnetic transducer element and the lapping monitor element, and to a method for manufacturing the magnetic transducer element.

2. Description of the Related Arts

With a growing tendency toward miniaturization with large capacity and toward higher recording density, a magnetic disk drive is being required to improve the performance of its thin film magnetic head. To this end, a composite thin film magnetic head is widely used as the thin film magnetic head, in place of a thin film head effecting record and reproduction through an induction type electromagnetic transducer element. The composite thin film magnetic head is of a structure where a recording head with an induction type magnetic transducer element for write is laid on a reproducing head with a magnetoresistance effect element (hereinafter referred to simply as MR element) for read.

As used herein, the MR element refers not only to elements using magnetoresistance effect materials represented by NiFe but also broadly to elements using multi-layered materials indicative of magnetoresistance effect, such as a spin valve, TMR (ferromagnetic tunnel effect) and CPP(Current Perpendicular to the Plane)-GMR (Giant Magneto-Resistance).

Up until now, the manufacture of the composite thin film magnetic head includes a polishing (lapping) step of adjusting the element height of the MR element (hereinafter referred to simply as MR height) to a predetermined level. Traditionally, to adjust the MR height to a predetermined dimension, a specific technique is employed, where an ELG (Electric Lapping Guide)sensor acting as a lapping monitor element is separately placed next to the proper MR element. Thus, while measuring the values of resistance of the ELG sensor caused by the lapping device and converting the measured values to the height of the MR elements, the lapping step of polishing up to the MR height is carried out.

Besides the ELG sensor, the lapping monitor element is also known as RLG (Resistance Lapping Guide) sensor, but their basic actions are the same and in this specification for convenience they are unified under the term ELG sensor.

Referring to FIGS. 19A and 19B there is shown an example of the conventional techniques, where the ELG sensor and the magnetic head having the MR element are disposed side by side. FIG. 19A is a sectional view of the layered state, and FIG. 19B is a top plan view of the same.

In FIGS. 19A and 19B, lower shields 102 are isolatedly separated from each other by way of separation layers 103 of $Al_2O_3$ etc., over which a nonmagnetic gap film 105 is formed. On top of the gap film 105, an MR element 100 including a magnetoresistance effect film (hereinafter referred to as MR film) 120 and an ELG sensor 200 including a lapping monitor film 220 are arranged side by side. A pair of leads 110 and a pair of leads 210 are attached respectively to both ends of the MR film 120 and both ends of the lapping monitor film 220. Then, the whole plane, indicated by a lower line $l_t$ in FIG. 19B, is lapped so that the direction of the arrow ($\alpha$) becomes shorter and when the predetermined MR height is reached, the lapping comes to a stop (for example, if line $l_f$ is the level at which the lapping should come to a stop, the length H in the diagram is the MR height).

Typically, the resistance of the lapping monitor film 220 of the ELG sensor 200 is measured and converted into the MR height using for example design values of the ELG sensor, and thus it is determined whether the predetermined MR height has been reached or not.

Typically, the lapping monitor film, which is a resistor used in the ELG sensor, lies in the same layer together with the MR element, as disclosed in Japanese Patent Laid-open Pub. No. 2000-6129 for example, with a view to reduction in the number of steps or simplicity of the manufacturing process. More specifically, in case of the example of FIGS. 19A and 19B, the MR film 120 and the lapping monitor film 220 are composed of a multilayered film of completely identical material, so that the lapping monitor film 220 can also function as the magnetoresistance effect film.

During the lapping step, however, a magnetic field may appear irregularly from the lapping device and adversely affect the determination of the MR height (this problem was presented for the first time by the present inventors). More specifically, since the ELG sensor uses the same layer together with the MR element, it may occur a magnetoresistance change due to the irregular magnetic field from the lapping device upon lapping, which resistance change may cause a change in the measured values of the ELG sensor. For this reason, the resultant MR height may become uneven, making it difficult to provide a precise MR height control upon lapping. This problem will become more remarkable accordingly as the rate of change in the resistance effect of the magnetoresistance effect film used in the MR element rise as a result of technical progress.

In other words, a higher recording density causes a greater demand for the improvement of output of the reproducing head, whereupon the rate of change in the resistance effect of the magnetoresistance effect film used in the MR element is steadily improved and increased to a large extent. Thus, with increased rate of change and raised sensitivity, the above problem that occurs during the lapping step will become even more remarkable.

SUMMARY OF THE INVENTION

The present invention was conceived in view of the above situations. It is therefore the object of the present invention to provide an ELG sensor (ELG element) which ensures stable resistant measured values of the ELG sensor upon lapping and allows a high accuracy MR height control, and to provide a combination of a magnetic transducer element and the ELG sensor, and a method for manufacturing the magnetic transducer element.

In order to solve the above problems, according to a first aspect of the present invention there is provided a lapping monitor element that is juxtaposed with a magnetic transducer element having a magnetoresistance effect film to determine the lapping position, upon lapping the element height of the magnetic transducer element to a predetermined dimension, the lapping monitor element comprising a resistance film to be resistance measured, the resistance film being a metal film of nonmagnetic transition metal or of alloy composed mainly of nonmagnetic transition metal, or a multilayered film where two or more such metal films are laid one upon another. This ensures stable resistance measured values of the ELG sensor upon lapping and allows a high accuracy MR height control.

In the present invention, the resistance film of the lapping monitor element is a film of metal selected from a group consisting of Ta, Cr, NiCr, Ti, CrTi, W, V, Ru, Rh, TiW, CrW, Nb and CrMo, or a multilayered film where two or more such metal films are laid one upon another. Thus, the resistance measured values of the ELG sensors upon lapping are significantly stabilized and even higher accuracy MR height control becomes possible.

In the present invention, a film thickness of the resistance film of the lapping monitor element is smaller than a film thickness of the magnetoresistance effect film juxtaposed therewith. Thus, when milling the magnetoresistance effect film and the lapping monitor film, sufficient over-milling on the lapping monitor film can be effected without incurring the problematic trailing at the height rear end of the ELG sensor.

In the present invention, the magnetic transducer element having the magnetoresistance effect film is formed in a matrix on a substrate, and when the substrate is severed into bars such that each bar contains a plurality of columns of magnetic transducer elements side by side, each column of elements within each bar contains at least two magnetic transducer elements. By virtue of this, the MR height control upon lapping can securely be provided.

According to a second aspect of the present invention there is provided a combined magnetic transducer element and lapping monitor element, comprising a magnetic transducer element having a magnetoresistance effect film, formed in a matrix on a wafer substrate, and a lapping monitor element disposed next to the magnetoresistance effect film, wherein the lapping monitor element is an element for determining the lapping position when lapping the element height of the magnetic transducer element having the magnetoresistance effect film, to a predetermined dimension, and wherein the lapping monitor element includes a resistance film to be resistance measured, and wherein the resistance film is a metal film of nonmagnetic transition metal or of alloy composed mainly of nonmagnetic transition metal, or a multilayered film where two or more such metal films are laid one upon another. This leads to acquisition of an element combination superior in mass-productivity, having stable ELG sensor resistance measured values upon lapping, and capable of providing a high accuracy MR height control.

According to a third aspect of the present invention there is provided a combined magnetic transducer element and lapping monitor element, comprising a magnetic transducer element having a magnetoresistance effect film, formed in columns on a substrate severed into bars, and at least two lapping monitor elements disposed next to the magnetoresistance effect film, wherein each of the at least two lapping monitor elements is an element for determining the lapping position when lapping the element height of the magnetic transducer element having the magnetoresistance effect film, to a predetermined dimension, and wherein each of the at least two lapping monitor elements includes a resistance film to be resistance measured, and wherein the resistance film is a metal film of nonmagnetic transition metal or of alloy composed mainly of nonmagnetic transition metal, or a multilayered film where two or more such metal films are laid one upon another. This leads to acquisition of an element combination superior in mass-productivity, having stable ELG sensor resistance measured values upon lapping, and capable of providing a high accuracy MR height control.

In the present invention, the resistance film of the lapping monitor element is a film of metal selected from a group consisting of Ta, Cr, NiCr, Ti, CrTi, W, V, Ru, Rh, TiW, CrW, Nb and CrMo, or a multilayered film where two or more such metal films are laid one upon another. Thus, it becomes possible to significantly stabilize the ELG sensor resistance measured values upon lapping and to provide an even higher accuracy MR height control.

In the present invention, a film thickness of the resistance film of the lapping monitor element is smaller than a film thickness of the magnetoresistance effect film. Thus, when milling the magnetoresistance effect film and the lapping monitor film, sufficient over-milling can be carried out on the lapping monitor film without causing any trailing problem at the ELG sensor height rear end.

According to a fourth aspect of the present invention there is provided a method for manufacturing a magnetic transducer element, comprising the steps of forming a combined magnetic transducer element bar and lapping monitor element, which includes a magnetic transducer element bar having a magnetoresistance effect film, formed in columns on a substrate and at least two lapping monitor elements juxtaposed with the magnetic transducer element; lapping the combined magnetic transducer element bar and lapping monitor element while monitoring the resistance value of a resistance film of each of the at least two lapping monitor elements; and removing the at least two lapping monitor elements and severing the magnetic transducer element bar formed on the substrate into a plurality of magnetic transducer elements; wherein the lapping monitor element has a resistance film to be resistance measured, and wherein the resistance film is a metal film of nonmagnetic transition metal or of alloy composed mainly of nonmagnetic transition metal, or a multilayered film where two or more such metal films are laid one upon another. This leads to stable ELG sensor resistance measured values upon lapping and a high accuracy MR height control.

In the method for manufacturing a magnetic transducer element in accordance with the present invention, the resistance film of the lapping monitor element is a film of metal selected from a group consisting of Ta, Cr, NiCr, Ti, CrTi, W, V, Ru, Rh, TiW, CrW, Nb and CrMo, or a multilayered film where two or more such metal films are laid one upon another. Thus, the resistance measured values of the ELG sensors upon lapping are significantly stabilized and even higher accuracy MR height control becomes possible.

In the method for manufacturing a magnetic transducer element in accordance with the present invention, a film thickness of the resistance film of the lapping monitor element is smaller than a film thickness of the magnetoresistance effect film juxtaposed therewith. Thus, when milling the magnetoresistance effect film and the lapping monitor film, sufficient over-milling on the lapping monitor film can be effected without incurring the problematic trailing at the height rear end of the ELG sensor.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Specific embodiments of the present invention will be described hereinbelow.

An ELG sensor, which is a lapping monitor element of the present invention, is used as monitoring means for determining the lapping position of a substrate when lapping the element height (so-called MR height) of a magnetic transducer element having a magnetoresistance effect film, to a predetermined dimension. The lapping monitor element is juxtaposed with the magnetic transducer element such that its function can be exerted upon the lapping process of the magnetic transducer element.

From viewpoint of mass-productivity of the magnetic transducer element, first formed is a combined magnetic transducer element and lapping monitor element, which comprises a magnetic transducer element having a magnetoresistance effect film, formed in matrix on a wafer substrate, and a lapping monitor element formed adjacent to the magnetoresistance effect film.

Thus, multilayered films making up the magnetic transducer elements and the lapping monitor elements are formed in matrix on the wafer substrate, and after that the wafer substrate is cut into a plurality of bars (bar-like members) in such a manner that each bar contains a magnetic transducer element whose magnetic pole end extends up to the edge of the substrate and plural columns of magnetic transducer elements juxtaposed with the magnetic transducer element.

Each cut bar is in the form of a combined magnetic transducer element and lapping monitor element, which includes a magnetic transducer element having a magnetoresistance effect film, formed in column on the substrate bar, and at least two lapping monitor elements adjoining the magnetoresistance effect film.

In order to secure the processing accuracy, it is preferable to array alternately the magnetic transducer elements and the ELG sensors on the bar form. In other words, it is desirable to place the ELG sensors on both sides of each magnetic transducer element.

As a simple and easy alternative, two ELG sensors may be positioned at both ends of the bar. The ELG sensors may also be arranged discretely at sites other than the both ends of the bar. In any event, at least two ELG sensors are disposed as element columns in a single bar.

Figure 11A:
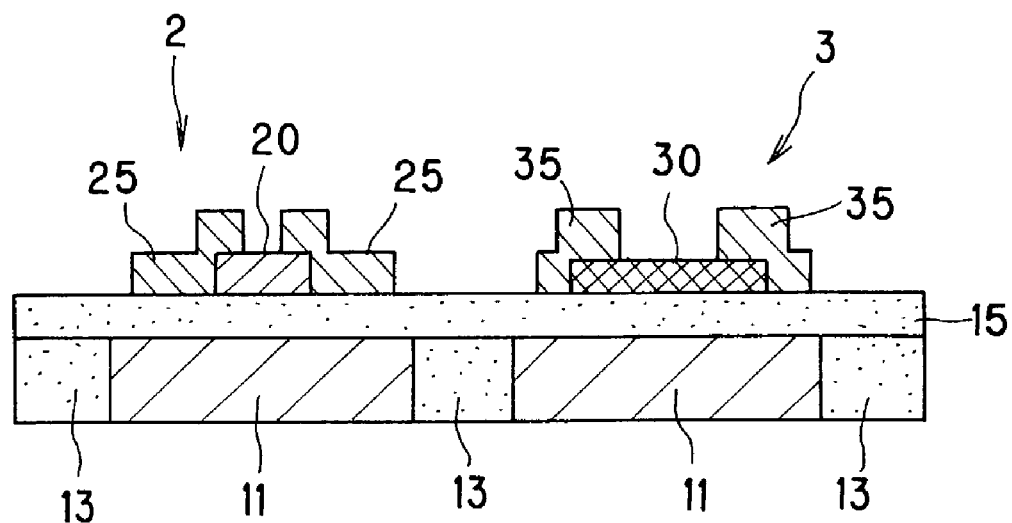
FIG. 11A is a sectional view, showing the layered state of the elements and the sensors.
Figure 11B:
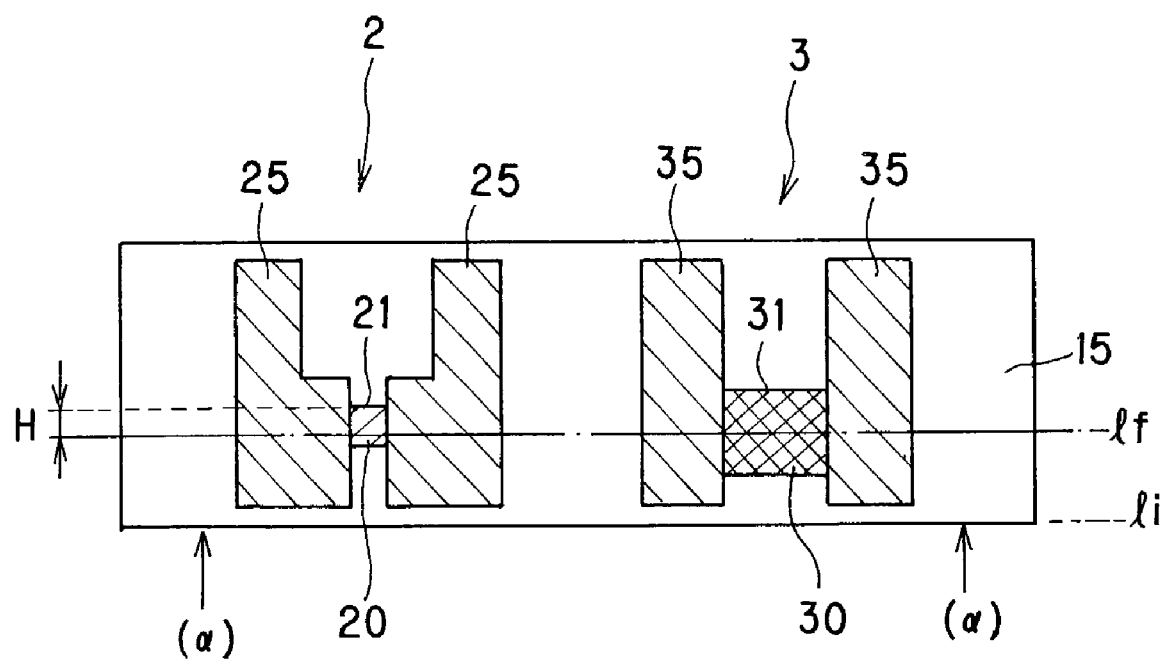
FIG. 11B is a top plan view of FIG. 11A.

Referring to FIGS. 11A and 11B, are shown the state where an ELG sensor 3 of the present invention is juxtaposed with a magnetic transducer element 2. FIG. 11A is a sectional view of the layered state, and FIG. 11B is a top plan view thereof. It is to be noted that FIG. 11A is a cross sectional at the position containing a magnetoresistance effect film 20 and a lapping monitor film 30 of FIG. 11B and that in these diagrams only one ELG sensor 3 and one magnetic transducer element 2 are shown in order to ease the understanding of the present invention.

In FIGS. 11A and 11B, lower shields 11 are isolatedly separated from each other by way of separation layers 13 of $Al_2O_3$ etc., over which a lower nonmagnetic gap layer 15 is formed. On top of the lower nonmagnetic gap layer 15 are arranged side by side a magnetoresistance effect element 2 including a magnetoresistance effect film 20, and an upper ELG sensor 3 including a lapping monitor film 30 which is a resistance film whose resistance is to be measured. A pair of leads 25 and a pair of leads 35 are attached to both ends of the magnetoresistance effect film 20 and of the lapping monitor film 30, respectively.

Specific lapping operations include lapping the whole plane indicated by lower line $l_r$ of FIG. 11B so that the direction of the arrow (α) becomes shorter, and bringing the lapping to a stop when the predetermined MR height is reached (for example, if line $l_f$ is the position at which the lapping should come to a stop, the length H in the diagram is the MR height). Judgment of whether the predetermined MR height has been reached is made by measuring the resistance of the lapping monitor film 30 of the ELG sensor 3, and converting the resistance values into the MR height by use of design values of the ELG sensor. In other words, the resistance values of the lapping monitor film 30 lapped simultaneously with the MR film 20 by the lapping device are measured, and while converting the measured values into the MR element height, lapping up to a desired MR height is carried out, thus effecting the lapping operation.

The ELG sensor of the present invention is characterized in that it is provided with the lapping monitor film 30 which is a resistance film to be resistance measured, the lapping monitor film 30 being made of materials different from the material of the magnetoresistance effect film 20. Such a lapping monitor film 30 is in the form of a film of nonmagnetic transition metal or a film of alloy composed mainly of nonmagnetic transition metal, or a multilayered film where two or more such metal films are laid one upon another.

As more preferred specific example, the lapping monitor film is in the form of a film of metal selected from a group consisting of Ta, Cr, NiCr, Ti, CrTi, W, V, Ru, Rh, TiW, CrW, Nb and CrMo, or of a multilayered film where two or more such metal films are laid one upon another. These materials are advantageous in terms of anticorrosion.

Although the lapping monitor film 30 of the ELG sensor is juxtaposed correspondingly to the magnetoresistance effect film 20, the film thickness of the lapping monitor film 30 is preferably smaller than the film thickness of the magnetoresistance effect film 20. More specifically, it is preferably 0.2 to 0.8 times the film thickness of the magnetoresistance effect film 20.

When this value is less than 0.2, there is a tendency to cause inconveniences such as increase in the variance of the initial resistance values of the lapping monitor film, due to intra-wafer film thickness distribution upon the formation of the lapping monitor film. When this value exceeds 0.8, there is a tendency to bring about inconveniences such as impossibility to perform sufficient over-milling of the lapping monitor film during the milling process of the magnetoresistance effect film and the lapping monitor film shown in FIGS. 9A and 9B, and thus the trailing at the ELG sensor height rear end becoming too long.

Furthermore, it is desirable that a rear edge 31 of the lapping monitor film 30 be positioned behind (above in the diagram) a rear edge 21 of the magnetoresistance effect film 20. This is due to the necessity to measure in optimal range the change of resistance of the lapping monitor film 30 to be lapped. In order to control the dimensional differences, it is desirable to form the lapping monitor film 30 and the magnetoresistance effect film 20 in the same process using the same photomask.

As set forth hereinabove, requirements for the materials of the lapping monitor film 30, which is a resistor of the ELG sensor, are firstly to have an optimum resistance value to exercise the function as the lapping monitor, and secondly to minimize the trailing at the height rear end in the MR height milling. For example, if Ta is used as the material of the lapping monitor film 30 and formed as film without underlayer, it will become a material (β-Ta) having too a high specific resistance. For this reason, to ensure the use at the optimal sheet resistance, there is a need to make the thickness of the lapping monitor film 30 fairly larger than the thickness of the multilayered film used in the magnetoresistance effect element. Hence, the trailing at the height rear end of the ELG sensor becomes too long, which may possibly make it difficult to provide a high accuracy MR height control.

From such a point of view, TiW is used as the material of the underlayer, as in the double-multilayered film of TiW/Ta, to thereby lower the specific resistance of the whole film (use of TiW as the material of the underlayer allows Ta to result in α-Ta with a low specific resistance), and thus it becomes possible to use as the ELG film a film which is thinner than the multilayered film used in the magnetoresistance effect element, and also to shorten the trailing at the height rear end of the ELG sensor. Other preferred examples of the double-multilayered film include W/Ta, CrTi/Ta and Cr/Ta.

Referring then to FIGS. 1A and 1B to FIGS. 11A and 11B, description will be made, by way of example, of a method for manufacturing a magnetic transducer element, which method includes a formation process where the ELG sensor of the present invention is juxtaposed with the magnetic transducer element.

FIGS. 1A to 11A are sectional views of the layered state of the element and the sensor, and FIGS. 1B to 11B are top plan views corresponding to FIGS. 1A to 11A, respectively.

Figure 1A:
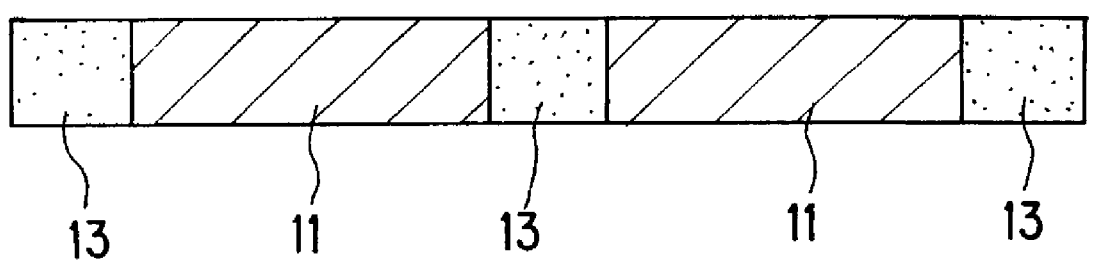
FIG. 1A is a sectional view, showing the layered state of elements and sensors.
Figure 1B:
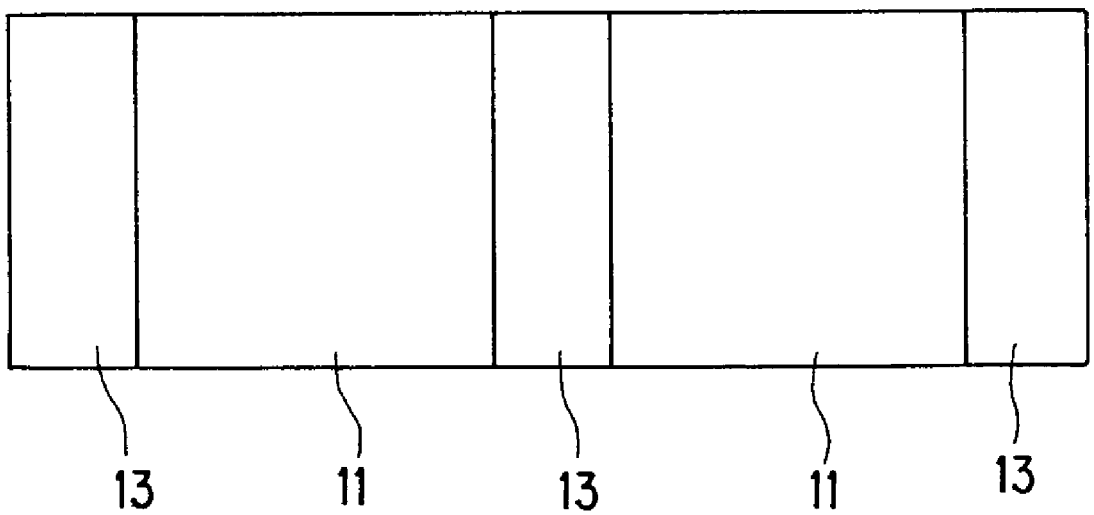
FIG. 1B is a top plan view of FIG. 1A.

First, as shown in FIGS. 1A and 1B, on a substrate not shown of $Al_2O_3$ TiC for example, the lower shields 11 are formed, isolatedly separated by separation layers 13 of $Al_2O_3$ for example. To ease the understanding of the present invention, an area (MR area) to form the magnetic transducer element 2 and an area (ELG area) to form the ELG sensor 3 are shown separately on the left side and the right side, respectively, of the diagrams.

Figure 2A:
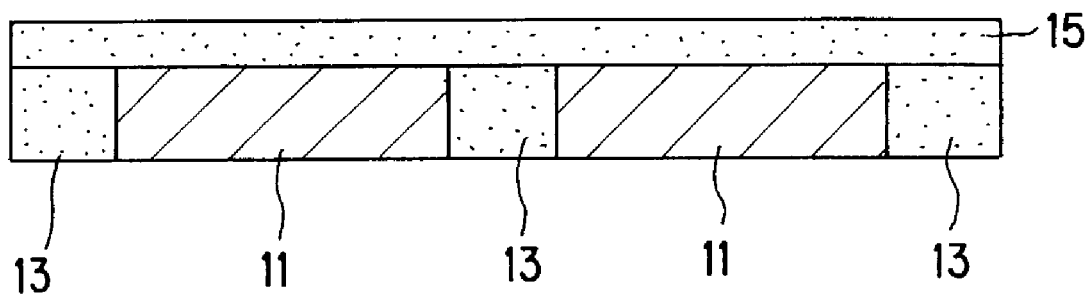
FIG. 2A is a sectional view, showing the layered state of the elements and the sensors.
Figure 2B:
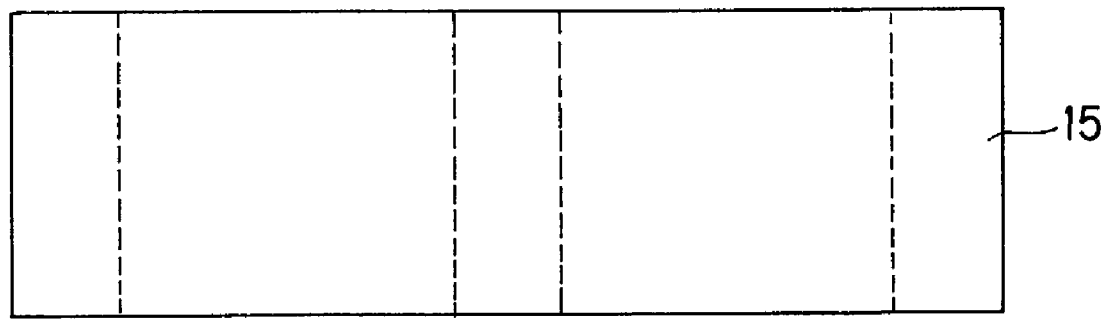
FIG. 2B is a top plan view of FIG. 2A.

Then, as shown in FIGS. 2A and 2B, the lower nonmagnetic gap layer 15 is formed thereon.

Figure 3A:
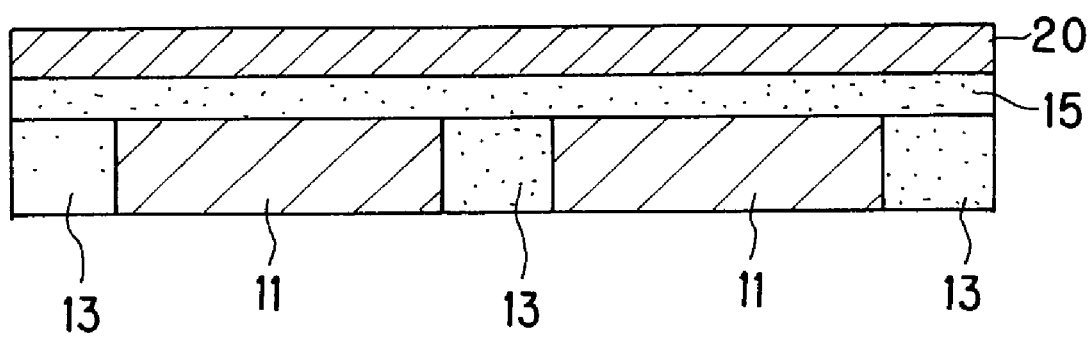
FIG. 3A is a sectional view, showing the layered state of the elements and the sensors.
Figure 3B:
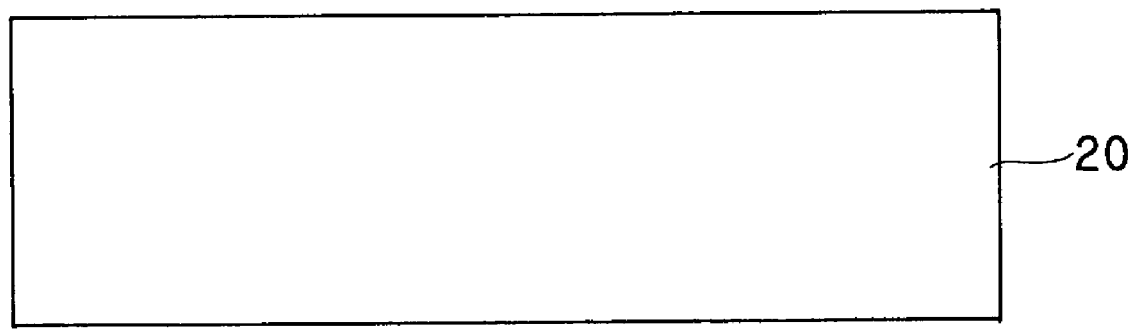
FIG. 3B is a top plan view of FIG. 3A.

Then, as shown in FIGS. 3A and 3B, the magnetoresistance effect film 20 is formed thereon.

Figure 4A:
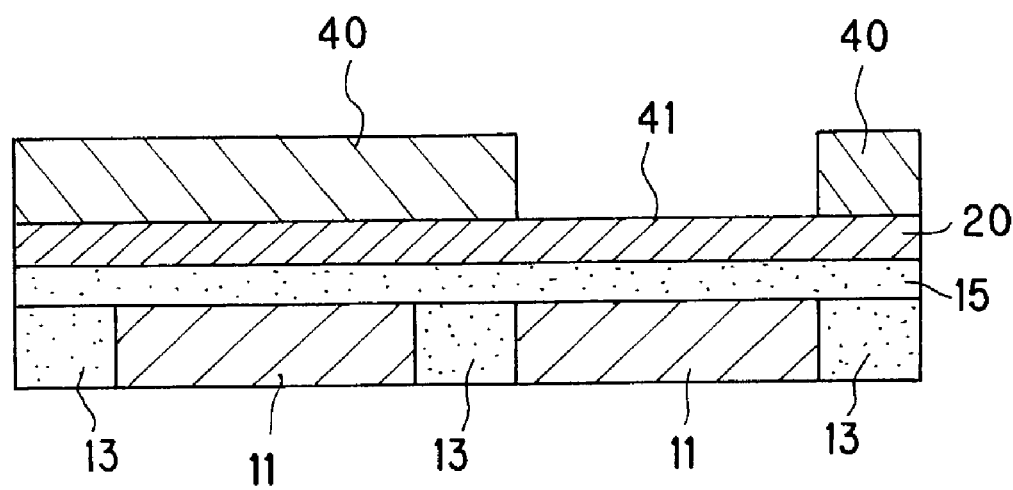
FIG. 4A is a sectional view, showing the layered state of the elements and the sensors.
Figure 4B:
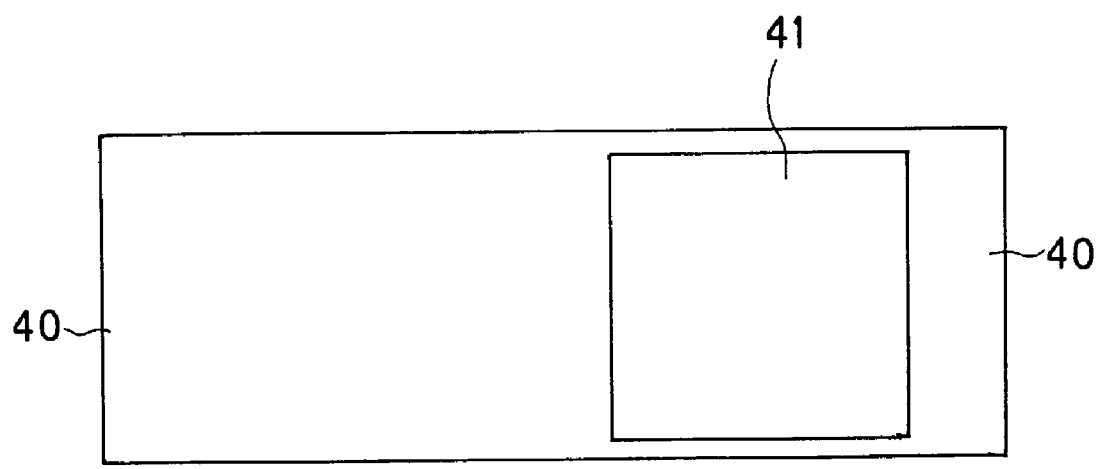
FIG. 4B is a top plan view of FIG. 4A.

Then, as shown in FIGS. 4A and 4B, on this magnetoresistance effect film a resist 40 is formed, and in the ELG area a resist pattern of a desired size is formed. At a site 41 where the resist pattern is formed, the magnetoresistance effect film is partly exposed as shown. FIG. 4A is a view of a section taken along the longitudinal axis of FIG. 4B.

Figure 5A:
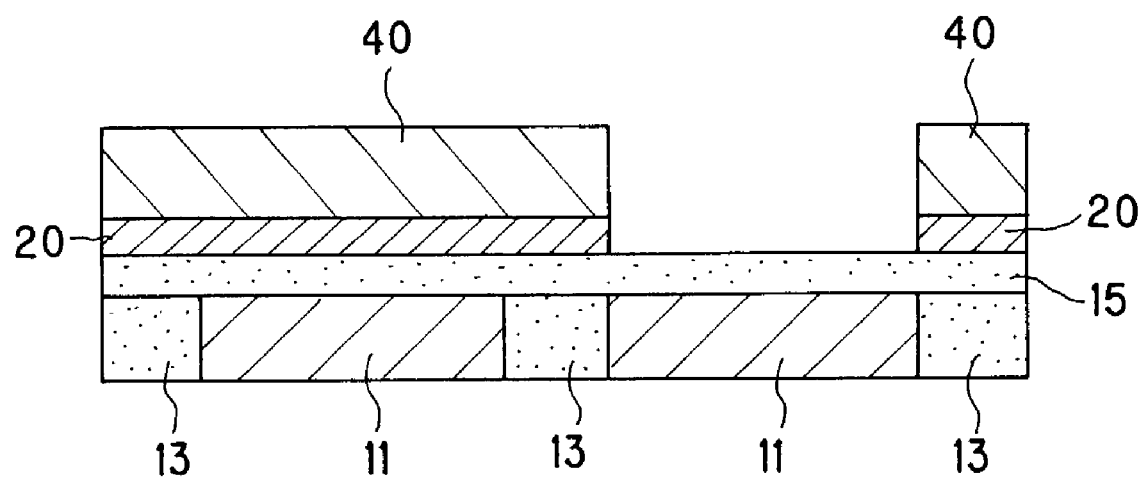
FIG. 5A is a sectional view, showing the layered state of the elements and the sensors.
Figure 5B:
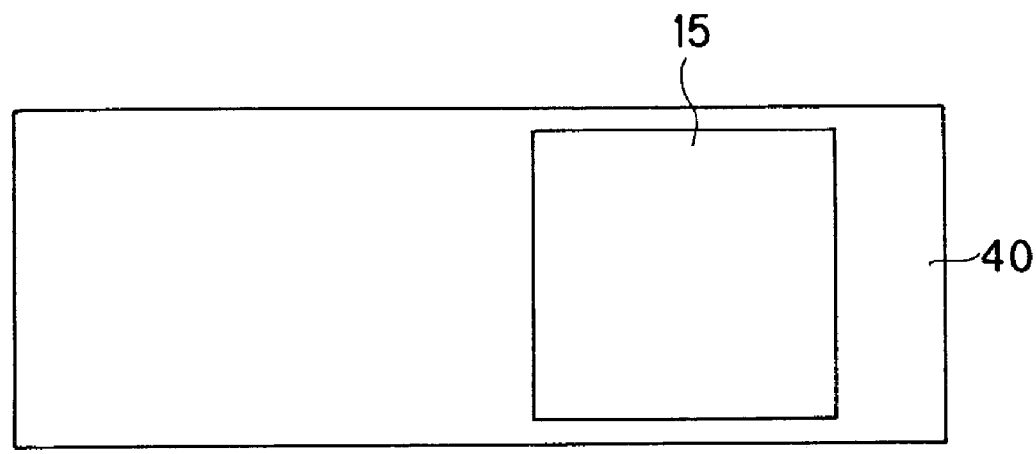
FIG. 5B is a top plan view of FIG. 5A.

Then, as shown in FIGS. 5A and 5B, the milling process is carried out to thereby remove the magnetoresistance effect film exposed as shown (the lower nonmagnetic gap layer 15 is partly exposed). FIG. 5A is a view of a section taken along the longitudinal axis of FIG. 5B.

Figure 6A:
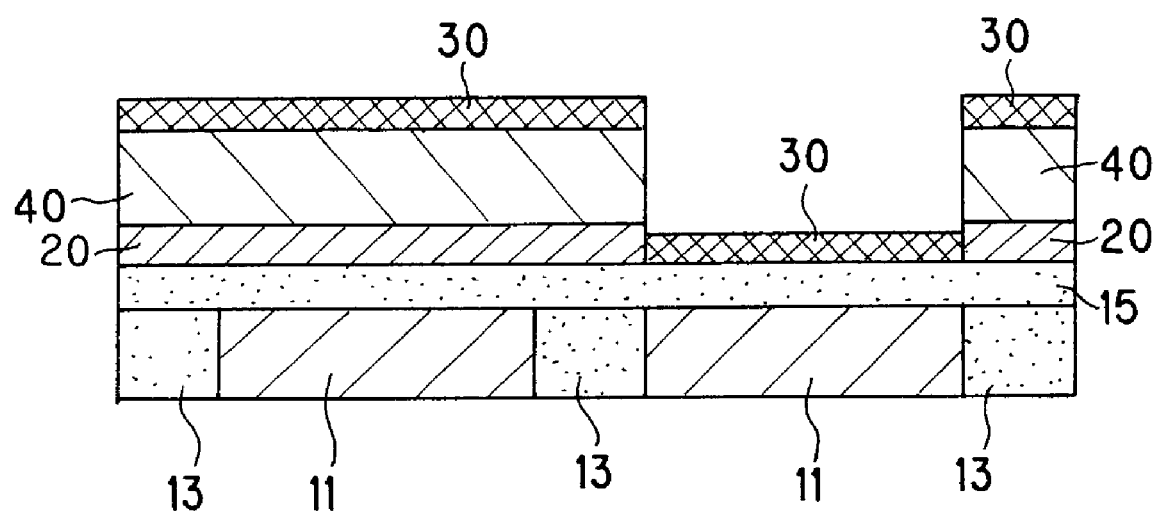
FIG. 6A is a sectional view, showing the layered state of the elements and the sensors.
Figure 6B:
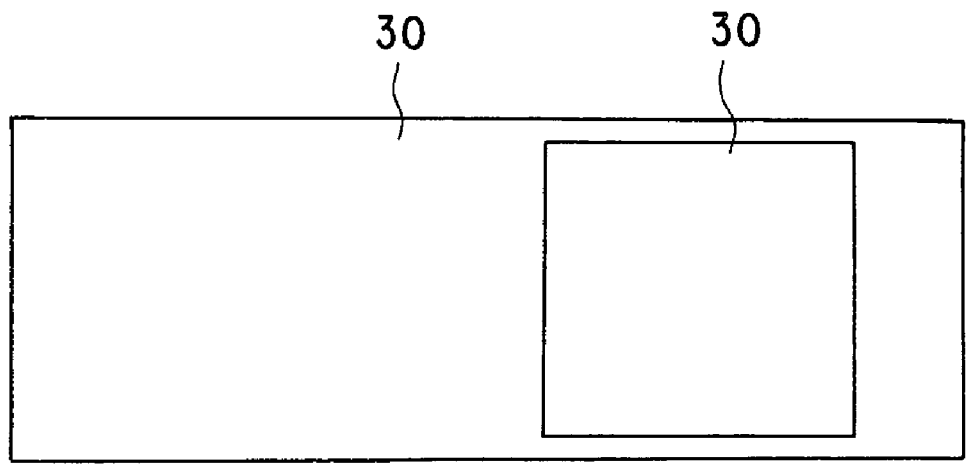
FIG. 6B is a top plan view of FIG. 6A.

Then, as shown in FIGS. 6A and 6B, the lapping monitor film 30, which is an ELG resistor, is formed. FIG. 6A is a sectional view taken along the longitudinal axis of FIG. 6B.

Figure 7A:
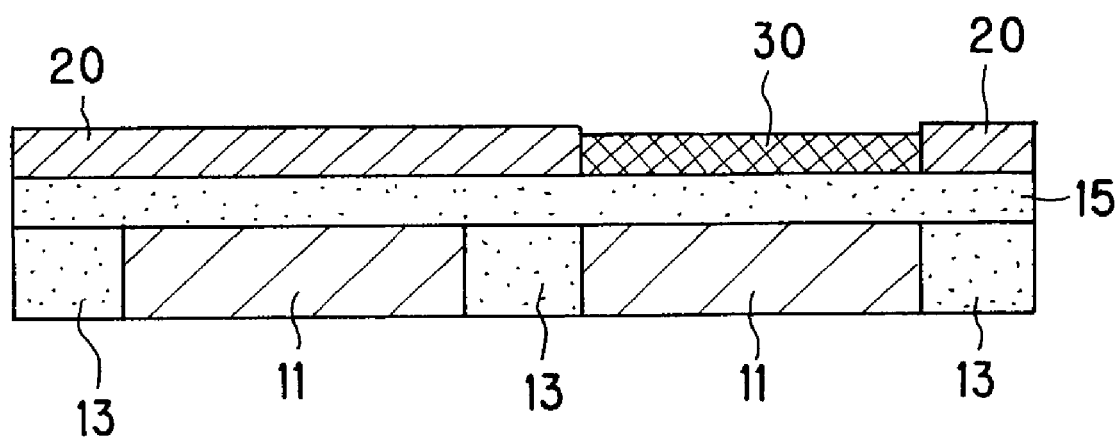
FIG. 7A is a sectional view, showing the layered state of the elements and the sensors.
Figure 7B:
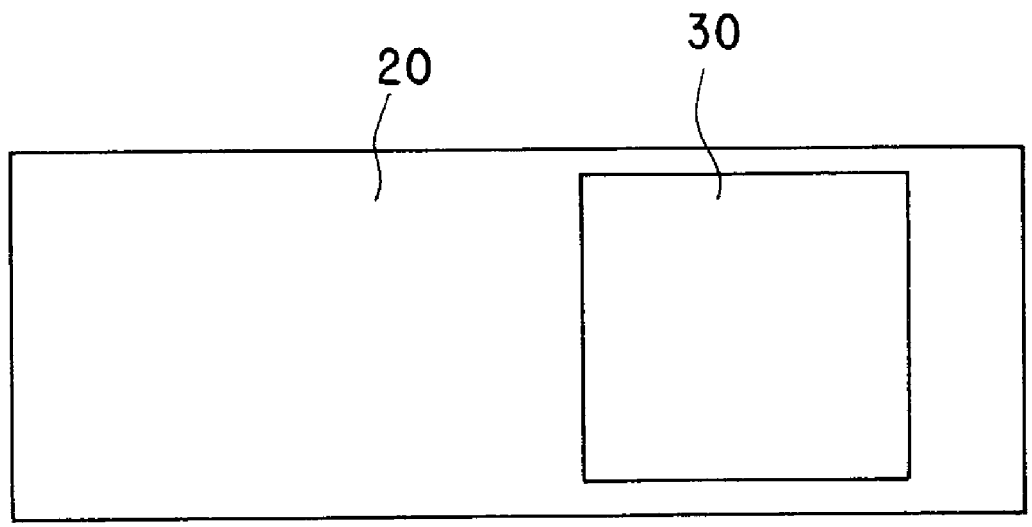
FIG. 7B is a top plan view of FIG. 7A.

Then, as shown in FIGS. 7A and 7B, the resist 40 is lifted off. FIG. 7A is a sectional view taken along the longitudinal axis of FIG. 7B.

Figure 8A:
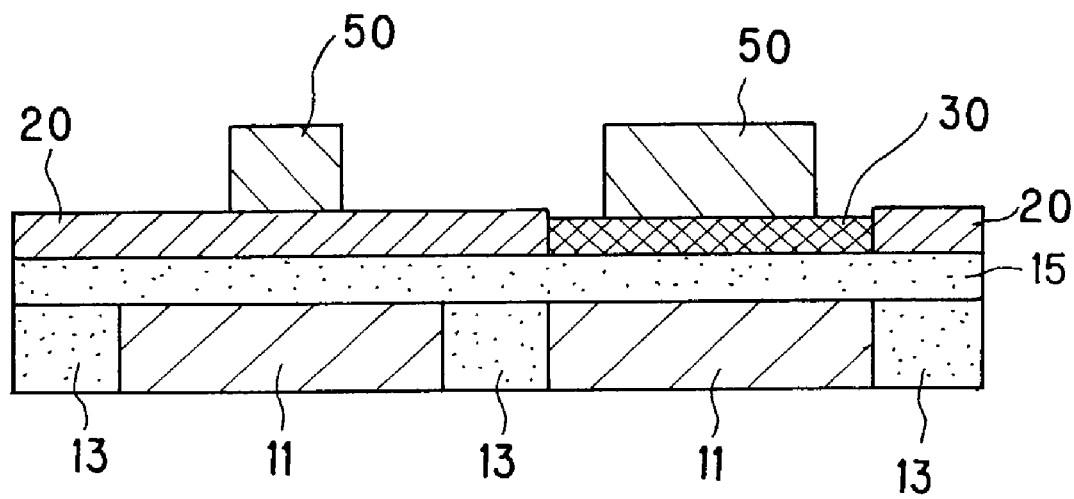
FIG. 8A is a sectional view, showing the layered state of the elements and the sensors.
Figure 8B:
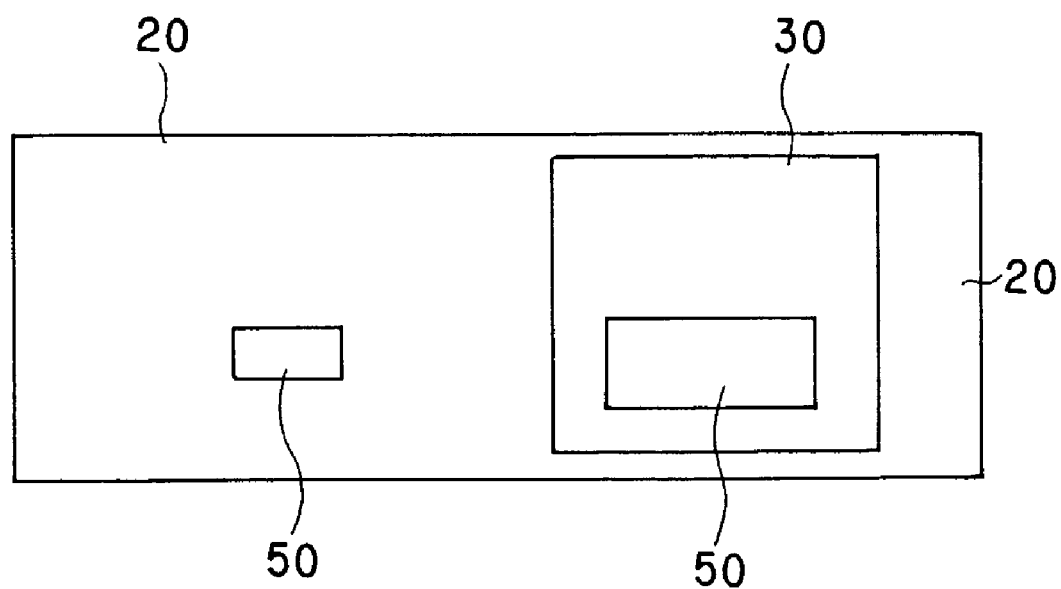
FIG. 8B is a top plan view of FIG. 8A.

Then, as shown in FIGS. 8A and 8B, a new resist 50 pattern is formed by photolithography. The site occupied by the resist corresponds to a site where the magnetoresistance effect film 20 and the lapping monitor film 30, which is an ELG resistor, are finally formed. FIG. 8A is a sectional view taken along a line containing the resist 50 pattern of FIG. 8B.

Figure 9A:
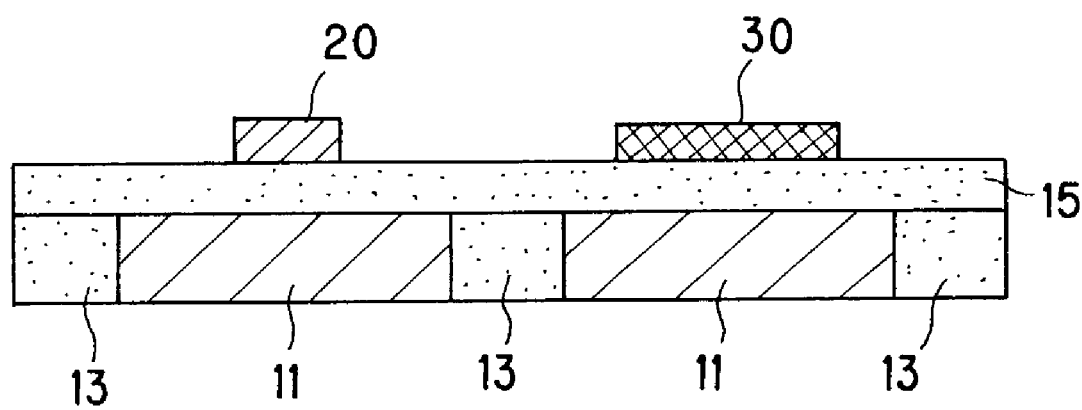
FIG. 9A is a sectional view, showing the layered state of the elements and the sensors.
Figure 9B:
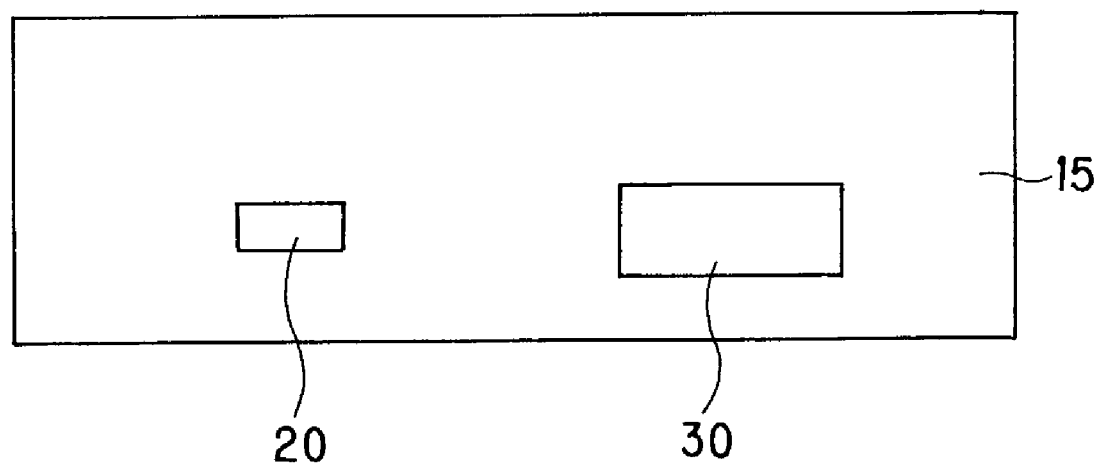
FIG. 9B is a top plan view of FIG. 9A.

Then, as shown in FIGS. 9A and 9B, the milling process of the magnetoresistance effect film and of the lapping monitor film is carried out depending on the resist pattern, after which the remaining resist is exfoliated. FIG. 9A is a sectional view taken along a line containing the magnetoresistance effect film 20 and the lapping monitor film 30 of FIG. 9B.

Figure 10A:
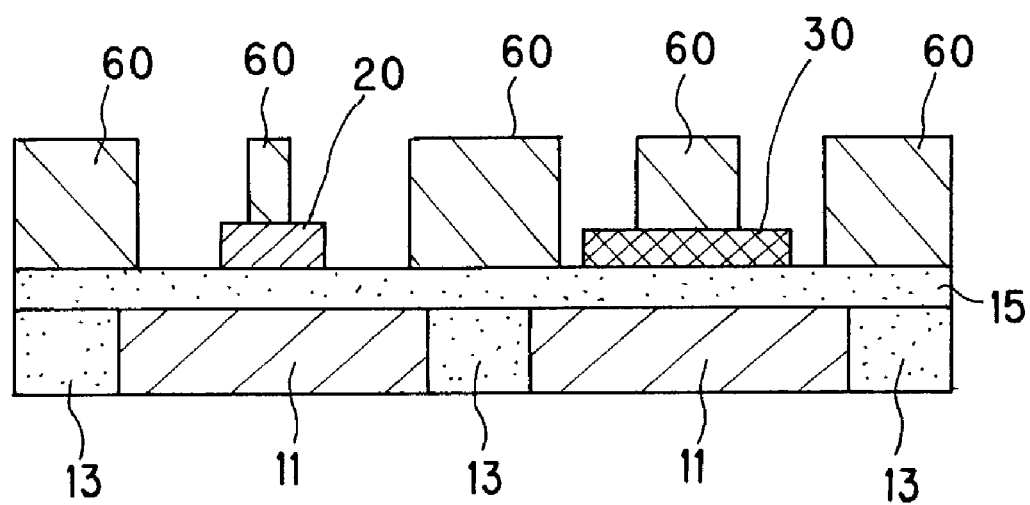
FIG. 10A is a sectional view, showing the layered state of the elements and the sensors.
Figure 10B:
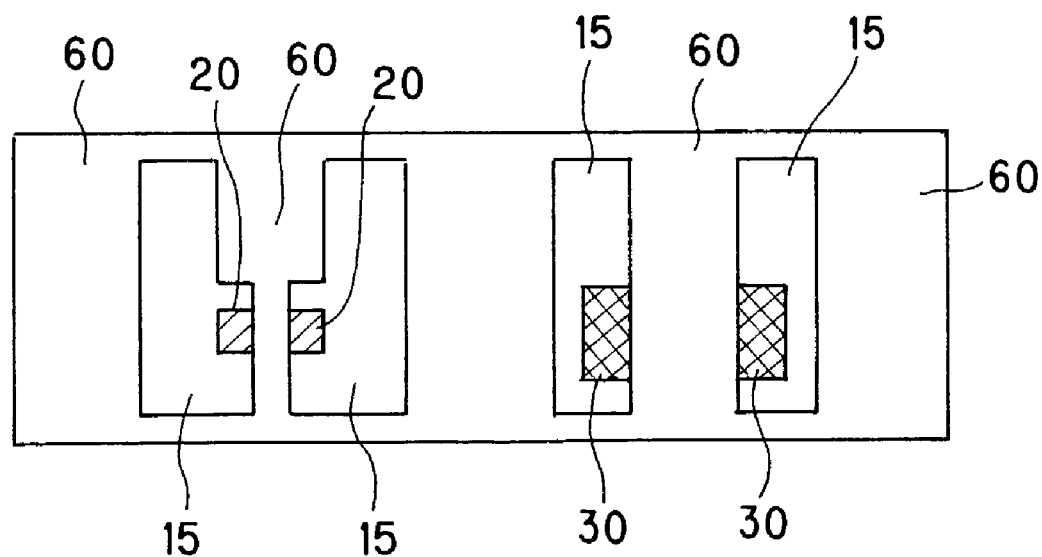
FIG. 10B is a top plan view of FIG. 10A.

Then, as shown in FIGS. 10A and 10B, a resist pattern 60 for forming the leads is formed by photolithography. FIG. 10A is a sectional view taken along a line containing the magnetoresistance effect film 20 and the lapping monitor film 30.

Then, as shown in FIGS. 11A and 11B, after the formation of the leads 25 and 35, the resist 60 is lifted off, and the form, where the ELG sensor 3 and the magnetoresistance effect element 2 are disposed side by side, is completed. FIG. 11A is a sectional view taken along a line containing the magnetoresistance effect film 20 and the lapping monitor film 30 of FIG. 11B.

Taking easy understanding of the present invention into consideration, FIGS. 11A and 11B are depicted as if the lapping step for lapping the MR height to a predetermined level starts after the previously described step. In practice, however, for the purpose of forming the recording head in addition to the reproducing head to thereby obtain a composite thin film magnetic head, the magnetic transducer element is subjected to further various thin film layering steps, and thereafter to lapping step. Description will be made hereinafter of the various thin film layering steps for additionally forming the recording head.

FIGS. 12A to 14 illustrate the process for forming the recording head on top of the magnetic transducer element 2 (reproducing head) having the magnetoresistance effect film 20 obtained through the above procedure.

Figure 12A:
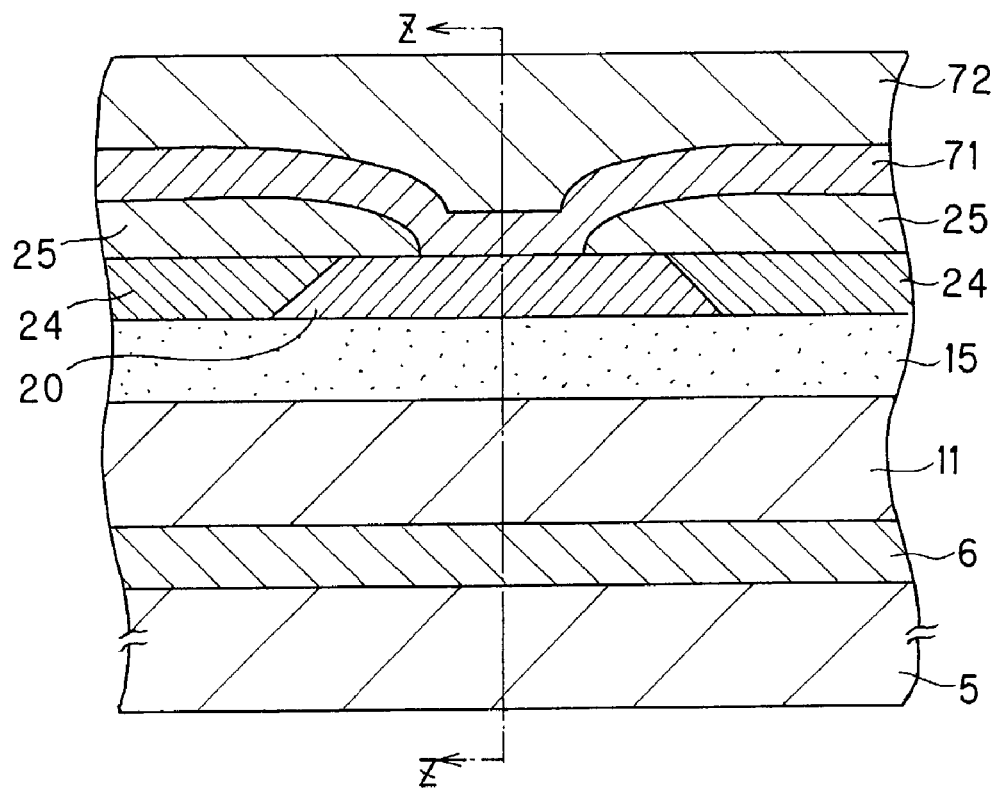
FIG. 12A is a view of a so-called ABS plane at the stage where an upper shield layer is stacked.
Figure 12B:
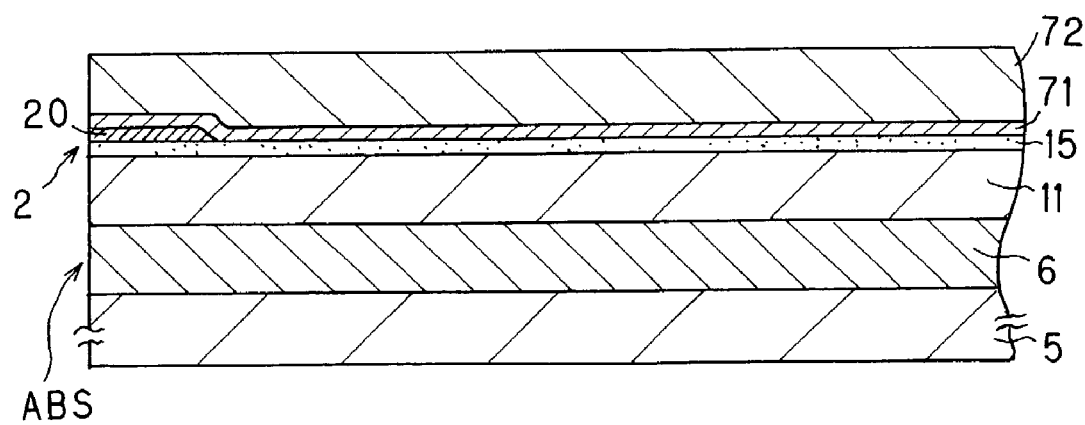
FIG. 12B is a sectional view taken along line Z-Z of FIG. 12A.

More specifically, an upper nonmagnetic gap layer 71 made of $Al_2O_3$ for example is formed to a thickness of the order of 10 to 100 nm on top of the reproducing head (which corresponds to the magnetic transducer element 2 of FIGS. 11A and 11B) having the magnetoresistance effect film 20 obtained through the above procedure. An upper shield layer 72 made of Permalloy or other magnetic materials is formed to a thickness of 1 to 4 µm on top of the upper nonmagnetic gap layer 71. FIG. 12A is view of a so-called ABS (Air Bearing Surface) at the stage where the upper shield layer 72 is layered, and FIG. 12B is a sectional view taken along a line Z-Z of FIG. 12A. The ABS is a surface which confronts the magnetic recording medium upon the recording/reproduction.

As shown in FIGS. 12A and 12B, the magnetoresistance effect film 20 is interposed between the lower nonmagnetic gap layer 15 and the upper nonmagnetic gap layer 71. Reference numerals 5 and 6 denote a substrate and a substrate protecting layer, respectively. Reference numeral 24 denotes a hard magnetic film for example, intended to be biased. Though different from the form of FIG. 11A, a modification as shown in FIGS. 12A and 12B will also be a preferred mode. It is to be understood that this modification does not make up the essential part in terms of the present invention.

Figure 13:
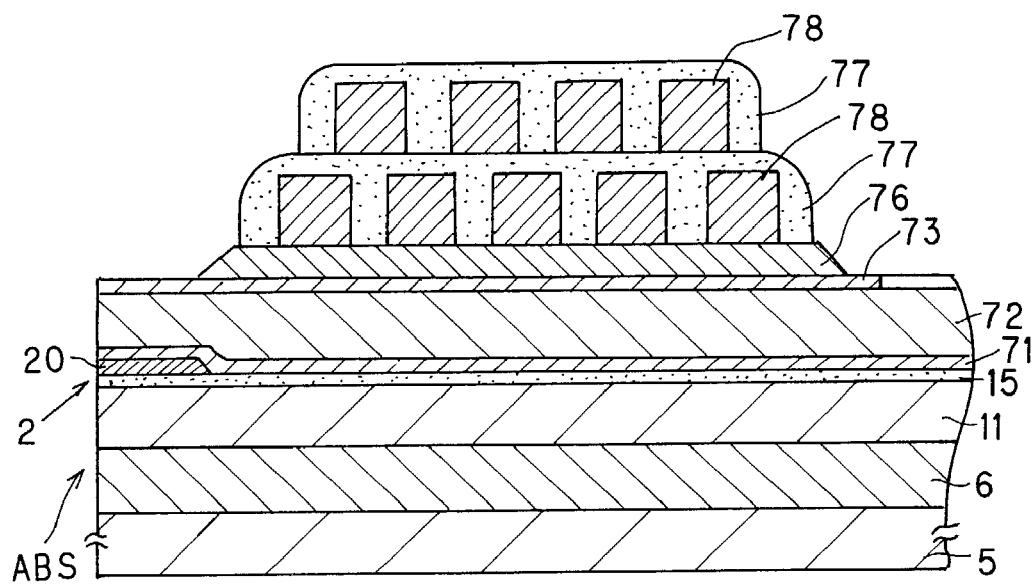
FIG. 13 is a sectional view for explaining a manufacture step added further to the state of diagram of FIG. 12B.

After the formation of the upper shield layer 72, as shown in FIG. 13, a recording gap layer 73 made of an insulating film is formed to a thickness of the order of 0.05 to 0.5 µm on top of the upper shield layer 72 by sputtering. A photo resist layer 76 is formed with a film thickness of the order of 1.0 to 2.0 µm into a predetermined pattern over the recording gap layer 73.

After the formation of the photo resist layer 76, a thin film coil 78 is formed with a film thickness of the order of 1 to 3 µm on top of the photo resist layer 76, and a photo resist layer 77 is formed into a predetermined pattern in such a manner as to cover the thin film coil 78.

In the embodiment shown in FIG. 13, a thin film coil 78 and a photo resist layer 77 are further formed on top of the photo resist layer 77. Although FIG. 13 shows the example where two layers of thin film coils are stacked, the number of layering may be one or more than three.

Figure 14:
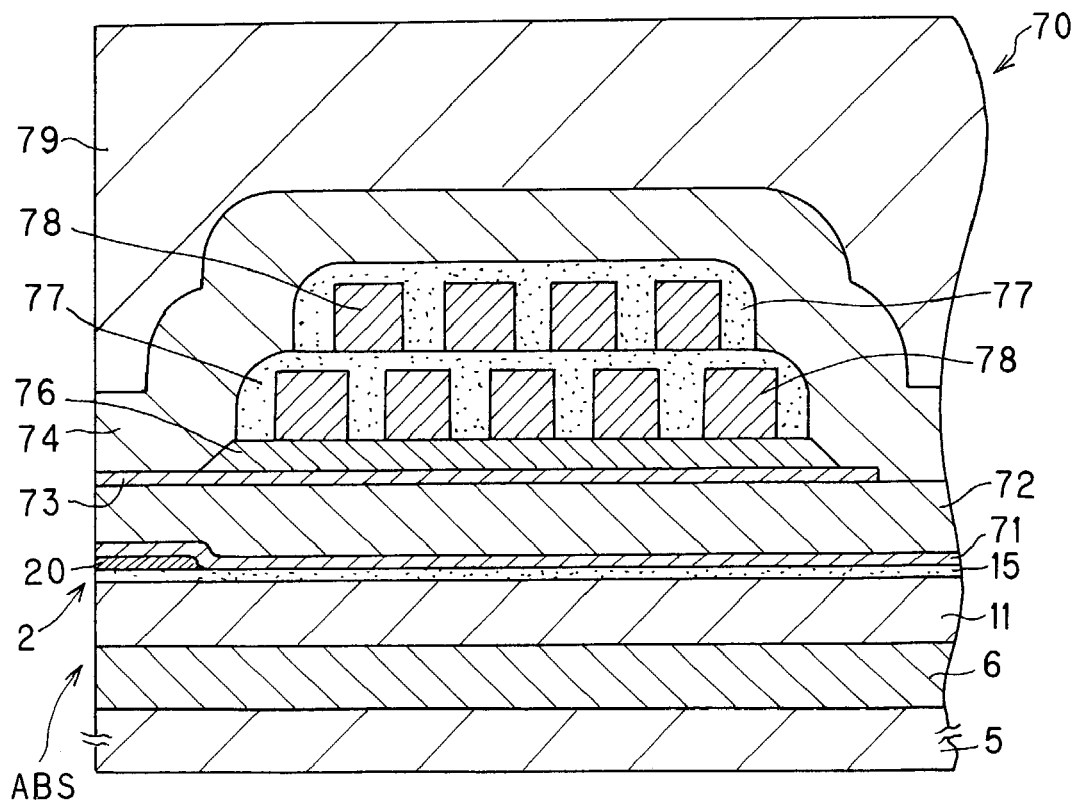
FIG. 14 is a sectional view for explaining a manufacturing step added further to the state of diagram of FIG. 13.

After the formation of the photo resist layer 76, as shown in FIG. 14, at positions corresponding to the central portion of the thin film coils 78 for example, the recording gap layer 73 is partly etched to form a contact hole for the formation of a magnetic path.

Afterward, an upper magnetic pole 74 made of a magnetic material having a high saturation magnetic flux density is formed with a thickness of about 3 µm so as to cover the recording gap layer 73, the contact hole and the photo resist layers 76 and 77 for example. After the formation of the upper magnetic pole 74, the recording gap layer 73 and the upper shield layer 72 are selectively etched by ion milling using this upper magnetic pole 74 as the mask.

Subsequently, over the upper magnetic pole 74 is formed an overcoat layer 79 made of alumina to a film thickness of the order of 20 to 30 µm. Through these steps, the composite thin film magnetic head 70 is formed.

After the formation of the overcoat layer 79, in case of using an antiferromagnetic material that needs heat treatment, as a part of the magnetoresistance effect film 20 or as a magnetic bias layer for example, antiferromagnetization process for fixing the direction of their magnetization is carried out. The antiferromagnetization process may be performed before the formation of the overcoat layer 79.

Finally, the ABS (indicated as ABS in the diagrams) is formed by machining the slider, to complete the composite thin film magnetic head. When forming this ABS, the lapping step is effected using the lapping monitor element 3 of the present invention to obtain the ultimate aimed MR height. The used lapping monitor element is cut away for removal.

Figure 15:
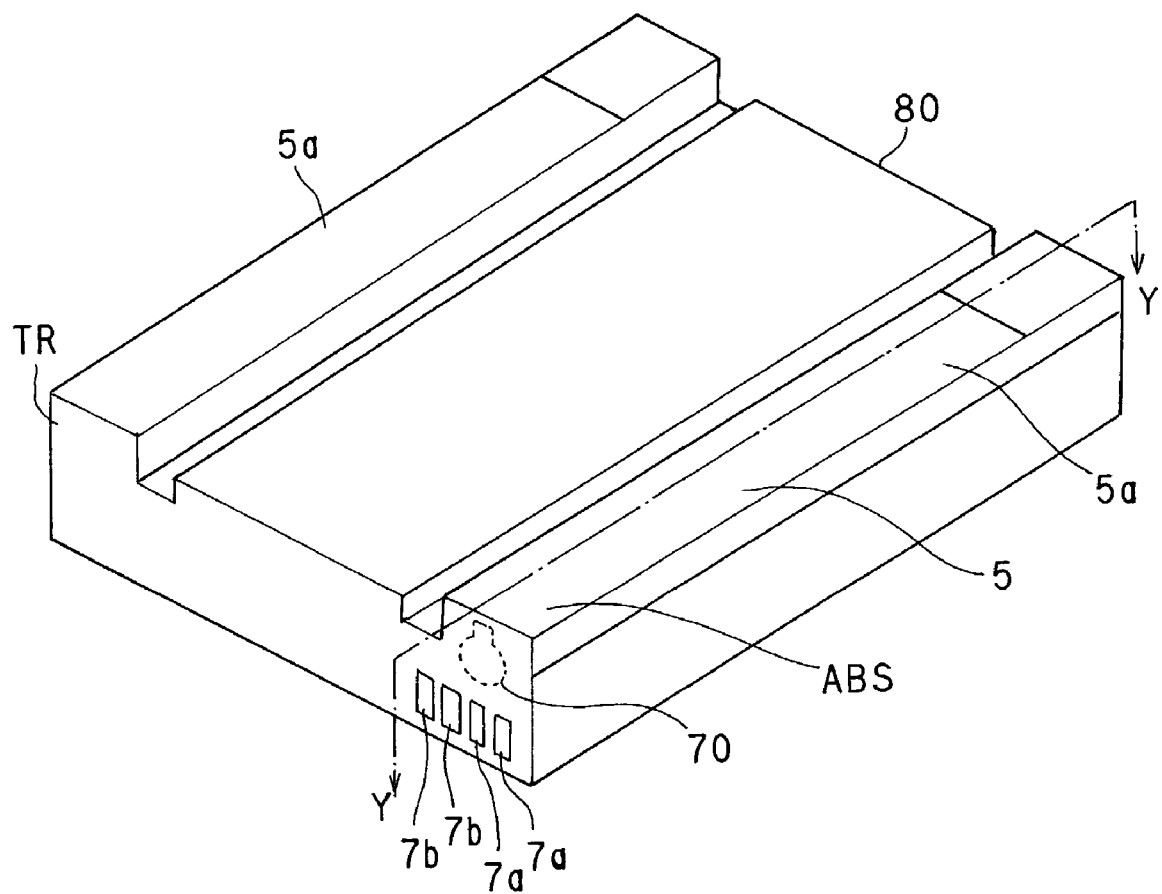
FIG. 15 is a schematic perspective view for explaining a slider which is a block containing a magnetic transducer element.

A block including the thus formed magnetic transducer element is configured as a so-called slider 80 as in FIG. 15. The slider 80 is integrated into a gimbal assembly 90, together with an actuator arm 91 as shown in FIG. 16.

Figure 16:
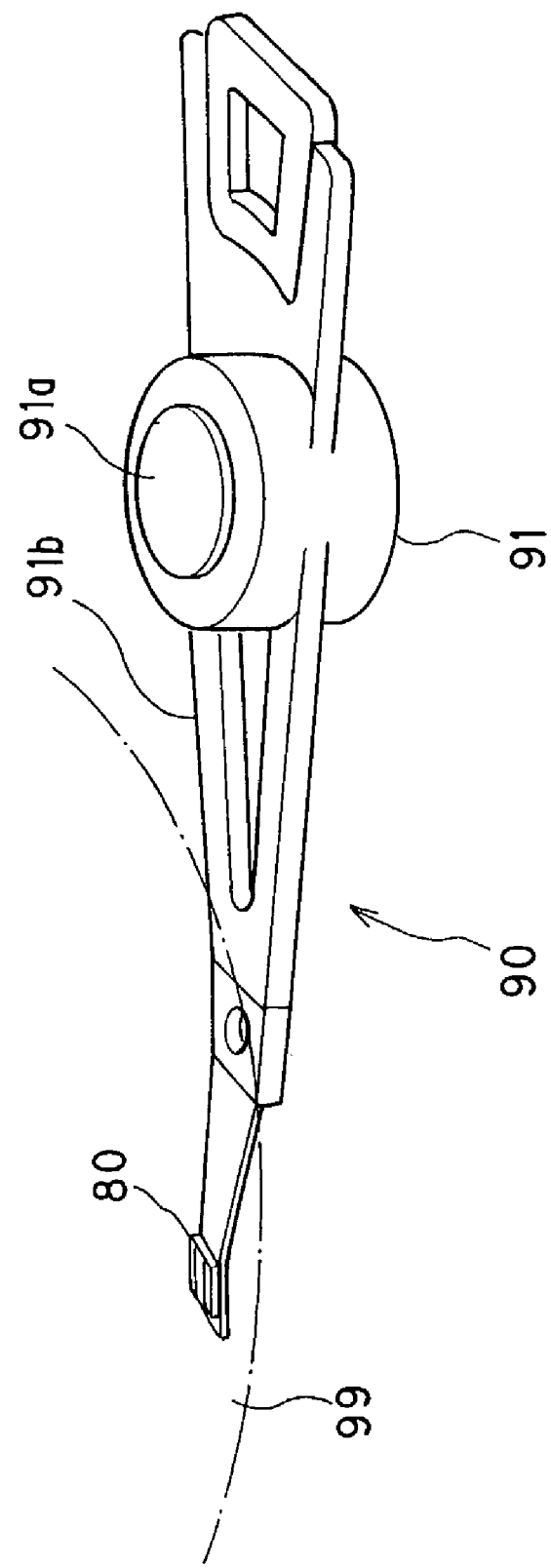
FIG. 16 is a schematic perspective view for explaining a gimbal assembly.

Referring to FIG. 16, the actuator arm 91 is used for example in a hard disk unit not shown, and has an arm portion 91b pivotally supported by a pivot 91a. The slider 80 having the composite thin film magnetic head 70 (FIG. 15) formed therein is disposed at the extremity of the arm portion 91b and confronts a record medium 99 of the hard disk indicated by a chain dotted line.

The arm portion 91b is arranged to rotate by the driving force of a voice coil motor not shown. This allows the slider 80 to move radially of the record medium 99, i.e., in the direction crossing the track lines, along the record surface (underside of the record surface in FIG. 16) of the magnetic record medium such as the hard disk. As a result of rotations of the magnetic record medium 99 and movements of the slider 80, information is recorded circumferentially of the magnetic record medium 99, i.e., in the track-line direction, or the recorded information is read out.

Referring again to FIG. 15, the slider 80 comprises a block-like substrate 5 made of $Al_2O_3$.TiC for example. The substrate 5 is formed into a substantially hexahedron for example such that one face thereof is in proximity to and confronts the recording surface of the magnetic record medium 99 as described hereinabove. The face confronting the recording surface of the magnetic record medium 99 is called ABS (indicated as ABS in the diagrams) as described above, and when the magnetic record medium 99 rotates, air flow occurring between the recording surface of the magnetic record medium 99 and the ABS allows the slider 80 to move by a minute distance away from the recording surface in the direction confronting the recording surface, thereby establishing a certain gap between the ABS and the magnetic record medium 99.

The slider 80 comprises a pair of rail 5a on the side of ABS so as to regulate the air flow occurring between the magnetic record medium 99 and the slider 80. The number of the rails is not limited to two. That is, one to three rails may be provided, or the plane without rail may be provided. For the purpose of improving the floating characteristics, the medium confronting surface may be provided with various geometric shapes. The present invention is applicable to all such sliders. The slider 80 may comprise, on the rail surfaces, a protection film made of DLC (Diamond-like Carbon), etc., having a film thickness of the order of 8 to 10 nm for example. In such a case, the protection film surface acts as the ABS.

The composite thin film magnetic head 70 having the recording head and the reproducing head is provided on the side of the trailing edge TR, with respect to the ABS of the substrate 5. On the trailing edge TR side of the slider 80 are provided reproducing electrodes 7a and recording electrodes 7b which are connected to the reproducing head and the recording head, respectively.

The section taken along line Y-Y of FIG. 15, i.e., taken along plane passing through the center of the composite thin film magnetic head 70, corresponds to the section of FIG. 14.

A specific example will be given hereinbelow to describe the present invention in greater detail.

An example wafer Wf#1 where the ELG sensors of the present invention are arranged and formed at predetermined positions, was prepared. A double-multilayered film of TiW (5 nm)/Ta(25 nm) was used as the resistor (lapping monitor film) of the ELG sensor of the example wafer.

Prepared as a comparative example wafer was a comparative example wafer Wf#2 which uses the conventional ELG sensor, i.e., the resistor (lapping monitor film) of the ELG sensor as the magnetoresistance effect film.

The film composition of the magnetoresistance effect film was Ta(5 nm)/NiFe(4 nm)/CoFe(1 nm)/Cu(2.1 nm)/CoFe(2 nm)/PtMn(18 nm)/Ta(5 nm).

These two wafers Wf#1 and Wf#2 were lapped and the dependencies (variations with time) of the height lapping level on the ELG sensor resistance were compared with each other. The results of experiment were shown in a graph of FIG. 17 (graph showing the relationship between the lap time and the sensor resistance values).

Figure 17:
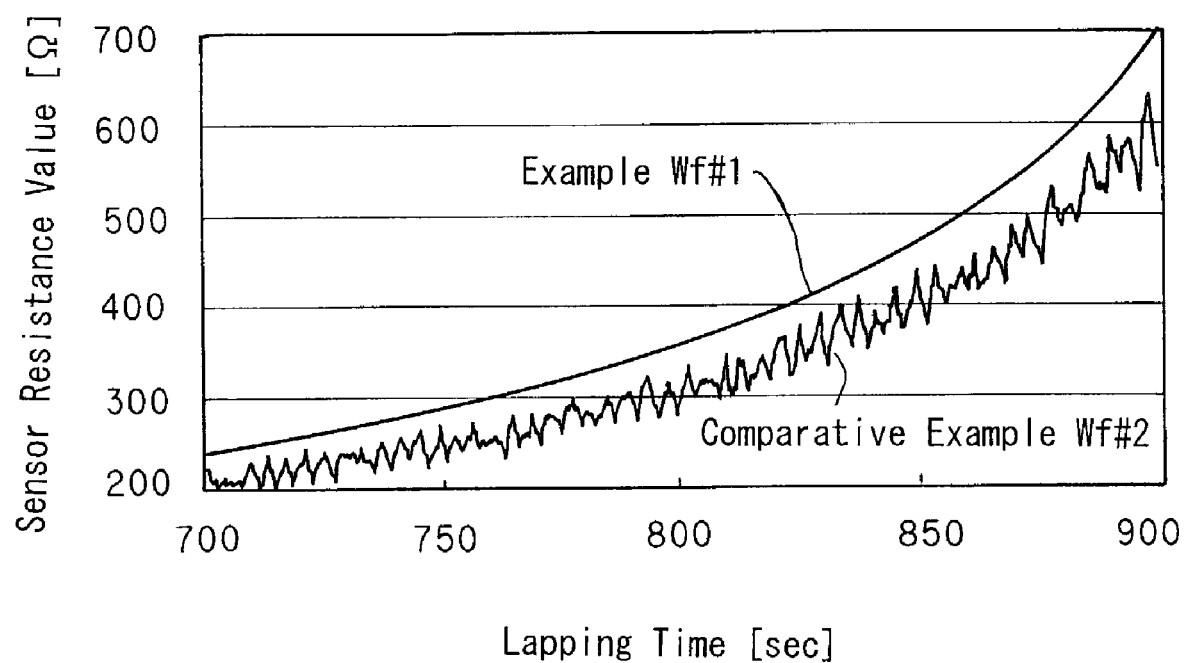
FIG. 17 is a graphical representation showing the relationship between the lap time and the sensor resistance values in two wafers Wf#1 and Wf#2.

As is apparent from the results shown in FIG. 17, the comparative example wafer Wf#2 caused changes in the magnetic resistance and thus the variances of measured values of the ELG sensor, due to magnetic fields generated from the lapping device, whereas the example wafer Wf#1 presented ideal height lapping level dependency, free from any resistance variances.

Figure 18:
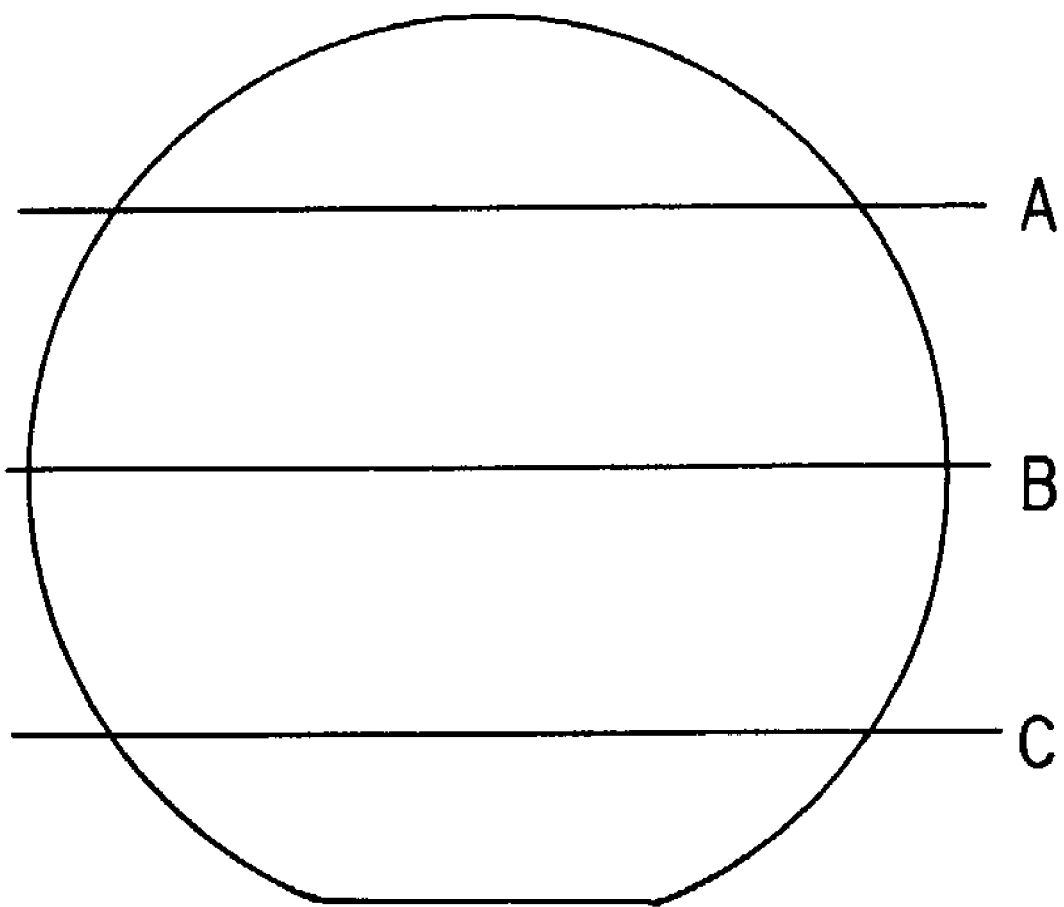
FIG. 18 is a top plan view diagrammatically showing cutting lines of an experimental wafer.
Figure 19A:
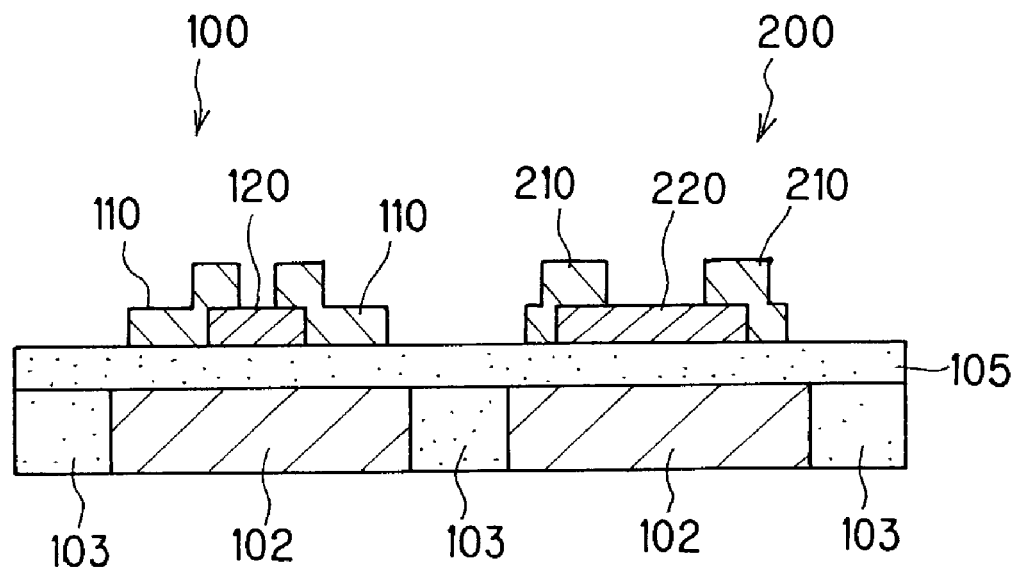
FIG. 19A is a sectional view showing the layered state of the elements and the sensors in the prior art.
Figure 19B:
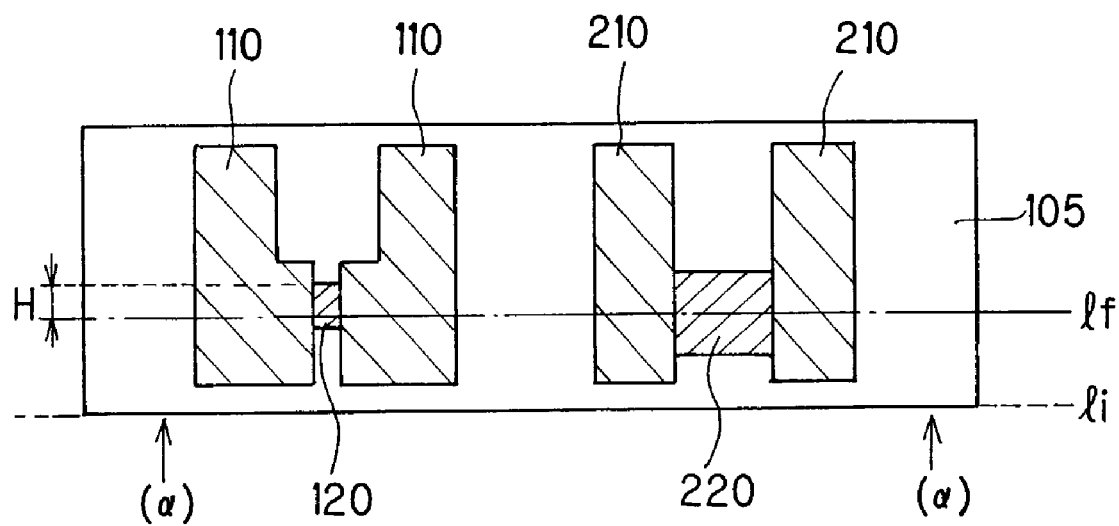
FIG. 19B is a top plan view of FIG. 19A.

Furthermore, in the above example wafer Wf#1 and comparative example wafer Wf#2, three bars taken along three lines A, B and C as shown in FIG. 18 were lapped, and the sections of the MR element portions were observed (10 points per bar) to compare the MR height variances. At that time, the MR height lapping target value was 0.200 μm.

The results are shown in Table 1 below.

From the above results, the effect of the present invention is evident. That is, the ELG sensor resistance measured values upon lapping become extremely stable and high accuracy MR height control can be provided, by virtue of the lapping monitor element of the present invention which is juxtaposed with a magnetic transducer element having a magnetoresistance effect film to determine the lapping position, upon lapping the element height of the magnetic transducer element to a predetermined dimension, the lapping monitor element comprising a resistance film to be resistance measured, the resistance film being a metal film of nonmagnetic transition metal or of alloy composed mainly of nonmagnetic transition metal, or a multilayered film where two or more such metal films are laid one upon another.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A combined magnetic transducer element and lapping monitor element, comprising:
    a magnetic transducer element having a magnetoresistance effect film, formed in a matrix on a wafer substrate; and
    a lapping monitor element juxtaposed with and separate from said magnetic transducer element on said wafer substrate, wherein
    said lapping monitor element is an element for determining the lapping position when lapping the element height of said magnetic transducer element having said magnetoresistance effect film, to a predetermined dimension,
    said lapping monitor element includes a resistance film to be resistance measured,
    said resistance film is a metal film of nonmagnetic transition metal or of alloy composed mainly of nonmagnetic transition metal, or a multilayered film where two or more such metal films are laid one upon another, and
    said resistance film and said magnetoresistance effect film comprise different materials.

2. A combined magnetic transducer element and lapping monitor element, comprising:
    a magnetic transducer element having a magnetoresistance effect film, formed in columns on a substrate severed into bars; and

TABLE 1

| | Bar A | | Bar B | | Bar C | | In Wafer Wf | |
|---|---|---|---|---|---|---|---|---|
| | Average Value (μm) | 3σ (μm) | Average Value (μm) | 3σ (μm) | Average Value (μm) | 3σ (μm) | Average Value (μm) | 3σ (μm) |
| Example Wafer Wf#1 | 0.200 | 0.049 | 0.202 | 0.043 | 0.199 | 0.045 | 0.200 | 0.046 |
| Comparative Example Wafer Wf#2 | 0.205 | 0.114 | 0.194 | 0.156 | 0.203 | 0.137 | 0.201 | 0.136 |

As is apparent from the results shown in Table 1, the present invention was proved to successfully suppress the MR height variances.

at least two lapping monitor elements juxtaposed with and separate from said magnetic transducer element on said substrate, wherein each of said at least two lapping monitor elements is an element for determining the lapping position when lapping the element height of said magnetic transducer element having said magnetoresistance effect film, to a predetermined dimension, each of said at least two lapping monitor elements includes a resistance film to be resistance measured, said resistance film is a metal film of nonmagnetic transition metal or of alloy composed mainly of nonmagnetic transition metal, or a multilayered film where two or more such metal films are laid one upon another, and said resistance film and said magnetoresistance effect film comprise different materials.

3. The combined magnetic transducer element and lapping monitor element according to claim 1 or 2, wherein said resistance film of said lapping monitor element is a film of metal selected from a group consisting of Ta, Cr, NiCr, Ti, CrTi, W, V, Ru, Rh, TiW, CrW, Nb and CrMo, or a multilayered film where two or more such metal films are laid one upon another.

4. The combined magnetic transducer element and lapping monitor element according to claim 1 or 2, wherein
a film thickness of said resistance film of said lapping monitor element is smaller than a film thickness of said magnetoresistance effect film juxtaposed therewith.

5. The combined magnetic transducer element and lapping monitor element according to claim 4, wherein a thickness of said resistance film is 0.2-0.8 times a thickness of said magnetoresistance effect film.

6. The combined magnetic transducer element and lapping monitor element according to claim 1 or 2, wherein said resistance film has a trailing edge positioned behind a rear edge of said magnetoresistance effect film.

* * * * *